United States Patent
Sakai et al.

(10) Patent No.: US 9,939,484 B1
(45) Date of Patent: Apr. 10, 2018

(54) VOLTAGE MEASUREMENT OF PIXELS OF A DISPLAY DEVICE

(71) Applicant: Amazon Technologies, Inc., Seattle, WA (US)

(72) Inventors: Toru Sakai, Waalre (NL); Jozef Elisabeth Aubert, Roermond (NL)

(73) Assignee: Amazon Technologies, Inc., Seattle, WA (US)

( * ) Notice: Subject to any disclaimer, the term of this patent is extended or adjusted under 35 U.S.C. 154(b) by 439 days.

(21) Appl. No.: 14/135,090

(22) Filed: Dec. 19, 2013

(51) Int. Cl.
G01R 31/26 (2014.01)
G01R 31/28 (2006.01)
G09G 3/34 (2006.01)

(52) U.S. Cl.
CPC ..... *G01R 31/2601* (2013.01); *G01R 31/2896* (2013.01); *G09G 3/348* (2013.01)

(58) Field of Classification Search
None
See application file for complete search history.

(56) References Cited

U.S. PATENT DOCUMENTS

| 5,883,437 | A | * | 3/1999 | Maruyama | G02F 1/136286 257/529 |
| 9,076,372 | B2 | * | 7/2015 | Yang | G09G 3/32 |
| 2007/0296391 | A1 | * | 12/2007 | Bertin | G01R 19/0092 323/303 |
| 2012/0306940 | A1 | * | 12/2012 | Machida | G02B 6/005 345/690 |
| 2013/0300775 | A1 | * | 11/2013 | Choi | G02B 26/005 345/690 |
| 2014/0043552 | A1 | * | 2/2014 | Chang | G02F 1/13454 349/43 |

* cited by examiner

*Primary Examiner* — Jermele M Hollington
*Assistant Examiner* — Douglas X Rodriguez
(74) *Attorney, Agent, or Firm* — EIP US LLP

(57) ABSTRACT

A method for operating a display device includes configuring at least a portion of a row or at least a portion of a column of pixels of the display device to produce interconnected pixels, wherein the interconnected pixels are interconnected to one another in an electrically parallel configuration to create a parallel capacitance that is larger than capacitances of each of the interconnected pixels; connecting a voltage-measuring probe to drains of TFTs of the interconnected pixels; applying source voltages to the TFTs of the interconnected pixels from one or more source lines and applying a gate voltage to the TFTs of the interconnected pixels from one or more gate lines; and measuring voltage of the TFT drains of the interconnected pixels.

18 Claims, 7 Drawing Sheets

VOLTAGE MEASUREMENT OF PIXELS OF A DISPLAY DEVICE

BACKGROUND

Electronic displays are found in numerous types of electronic devices such as electronic book ("eBook") readers, cellular telephones, smart phones, portable media players, tablet computers, wearable computers, laptop computers, netbooks, desktop computers, televisions, appliances, home electronics, automotive electronics, augmented reality devices, and so forth. Electronic displays may present various types of information, such as user interfaces, device operational status, digital content items, and the like, depending on the kind and purpose of the associated device. The appearance and quality of a display can affect a user's experience with the electronic device and the content presented thereon. Accordingly, finding ways to enhance user experience and satisfaction continues to be a priority. Moreover, increased multimedia use imposes high demands on designs and operations of display devices, as content available for mobile use becomes visually richer.

Electronic displays generally include an array of transmissive or reflective pixels configured to be operated by an active matrix addressing scheme. For example, rows and columns of pixels are operated by controlling voltage levels on a plurality of source lines and gate lines.

BRIEF DESCRIPTION OF THE DRAWINGS

The detailed description is described with reference to non-limiting and non-exhaustive embodiments illustrated in the accompanying figures. The same reference numerals in different figures refer to similar or identical items.

DETAILED DESCRIPTION

Overview

Figure 1:
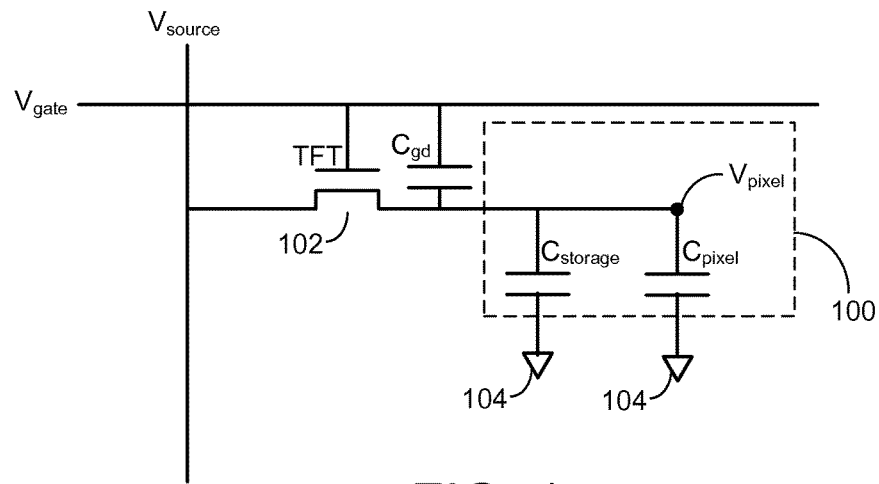
FIG. 1 is a schematic diagram of an electronic circuit representative of a pixel of a display device, according to various embodiments.

In various embodiments described herein, electronic devices include displays for presenting content and other information. In some examples, the electronic devices may also include one or more additional components associated with the display, such as a touch sensor component layered atop the display for detecting touch inputs, a front light or back light component for lighting the display, and/or a cover layer component, which may include antiglare properties, antireflective properties, anti-fingerprint properties, anti-cracking properties, and the like. Various embodiments described herein also include techniques for assembling electronic devices including these component stacks for the displays and other features described herein.

In some examples, the display may include, or may have associated therewith, an outer layer or protective sheet applied during manufacture of the display. The protective sheet is a transparent sheet that overlies and protects an image-displaying component of the display so that the image-displaying component is viewable through the protective sheet. When assembling an electronic device, one or more additional components may be stacked on top of or otherwise coupled to the protective sheet to produce a display assembly of the electronic device. In some cases, the one or more additional components are coupled to the protective sheet by a liquid optically clear adhesive (LOCA) that adheres the additional component(s) to the protective sheet. The LOCA may be cured through photo initiation using ultraviolet (UV) light.

A display device, such as an electrowetting display device, for example, can be a thin film transistor liquid crystal display (TFT-LCD) that generally includes an array of transmissive or reflective pixels configured to be operated by an active matrix addressing scheme. For example, rows and columns of pixels are operated by controlling voltage levels on a plurality of source lines and gate lines. In this fashion, the display device can produce an image by selecting particular pixels to transmit, reflect or block light. Pixels are addressed (e.g., selected) via rows and columns of the source lines and gate lines that are connected to transistors (e.g., used as switches) included in each pixel. Transistors take up a relatively small fraction of the area of each pixel to allow light to easily pass through (or reflect from) the pixel.

Electrically, the pixel is a small capacitor with a layer of insulating optical material (e.g., liquid crystal material or electrowetting material) sandwiched between transparent conductive indium tin oxide (ITO) layers. A one-way current-passing characteristic of the transistor of the pixel prevents charge that is being applied to the pixel from draining between refresh cycles of the display's image. However, because of the capacitive aspect of the pixel, charge can undesirably leak out of the pixel and affect optical characteristics of the pixel over time.

The voltage of the pixel is representative of charge on the pixel. Accordingly, measuring this voltage can be beneficial by allowing a determination of the rate of charge leakage and the charge remaining on the pixel. Such information can allow for modifying how the pixel is operated so as to account for changing characteristics of the pixel. For example, as charge on the pixel decays, voltage on a source line connected to the pixel can be ramped up. Another benefit of measuring pixel voltage is that various physical processes of pixels and display devices can be understood by analyzing parameters such as white area of pixels and TFT degradation, just to name a few examples, with respect to pixel voltage. Though there are a number of benefits for measuring pixel voltage, the very small capacitance (e.g., a few picofarads) of the pixel poses challenges for making such measurements.

Accordingly, in various embodiments, a display device can be configured to allow for measuring pixel voltage. Such voltage measurements can be performed during operation of the display device, in real time, for example. At least a portion of a row or at least a portion of a column of pixels of the display device can be configured to have interconnected pixels. The interconnected pixels are interconnected to one another in an electrically parallel configuration to create a parallel capacitance that is larger than capacitances of each of the interconnected pixels. The larger capacitance allows a voltage-measuring device to measure the voltage on the interconnected pixels. A probe of the voltage-measuring device can be connected to drains of TFTs of the interconnected pixels. Such connection between a probe and drains of TFTs can include a direct physical connection between conductive structures of the probe and the drains, for example. In some implementations, such connection between a probe and drains of TFTs can include switches that selectively form an electrical connection (closed switch position) or electrical isolation (open switch position) between conductive structures of the probe and the drains, for example. Source voltages and gate voltages can be applied to the TFTs of the interconnected pixels from one or more source lines and from one or more gate lines, respectively. Though the interconnected pixels comprise a small portion of the array of pixels of the display device, pixel voltage of the interconnected pixels is the same or similar to the pixel voltage of other pixels of the array of pixels.

Illustrative Environment

FIG. 1 is a schematic diagram of an electronic circuit representative of a pixel 100 of a display device, according to various embodiments. The display device includes an array of rows and columns of such pixels. The display device also includes rows of gate lines and columns of source lines that are connected to TFTs of individual pixels. For example, TFT 102 is connected to a gate line $V_{gate}$ and a source line $V_{source}$ and acts as a switch to select or deselect pixel 100. In particular, gate line $V_{gate}$ is connected to the gate of TFT 102 and a source line $V_{source}$ is connected to the source of TFT 102. The drain of TFT 102 is connected to pixel 100. Capacitor $C_{gd}$ represents a parasitic capacitance formed across the gate-drain interface of TFT 102. Capacitance $C_{storage}$ represents a parasitic capacitance formed across the drain-common interface of TFT 102. Pixel 100 includes capacitance $C_{pixel}$, which represents a capacitance formed by a multiple dielectric layer stack between two electrodes (not shown) of pixel 100. $V_{pixel}$ is the voltage of the pixel with respect to common or ground 104. $V_{pixel}$ is also the voltage of the drain of TFT 102.

Figure 2:
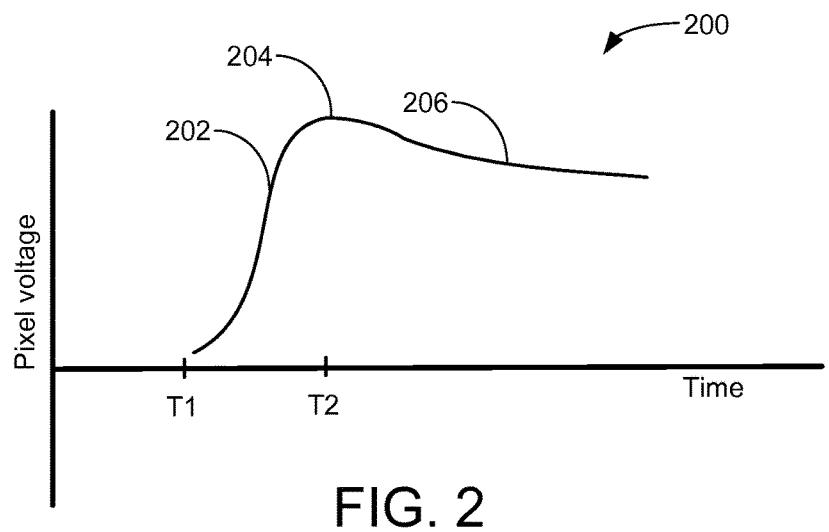
FIG. 2 is a plot of pixel voltage as a function of time, as measured by various example embodiments.

FIG. 2 is a plot 200 of pixel voltage as a function of time, as measured by various embodiments described below. For example, the pixel voltage is $V_{pixel}$ that is the voltage of the drain of TFT 102, as shown in FIG. 1. Plot 200 is over a time span that includes turn-on of the TFT of the pixel at time T1 and turn-off of the TFT at time T2. Specifically, subsequent to T1, when the TFT is turned-on (e.g., by applying a turn-on voltage from a gate line), charge from a source line connected to the source of the TFT accumulates on the pixel (e.g., the drain of the TFT). Pixel voltage correspondingly increases, as shown by portion 202 of plot 200. At time T2, when the TFT is turned-off, charge ceases to accumulate on the pixel and the pixel voltage peaks, as shown by peak portion 204 of plot 200. Subsequent to time T2, instead of remaining at a constant value, the charge decays by charge leakage through the TFT, through electrolyte of the pixel, through parasitic capacitances, and so on. Accordingly, the pixel voltage decreases, as shown by portion 206 of plot 202.

As mentioned above, measuring pixel voltage presents a challenge because a capacitance of a measuring device is comparable to the capacitance of an individual pixel (e.g., $C_{gd}$, $C_{storage}$ and/or $C_{pixel}$). For example, a field effect transistor (FET) probe, which can be used to measure pixel voltage, has an input impedance of several picofarads, which is comparable to the capacitance of a single pixel. A display device, however, can be configured to allow for measuring pixel voltage by interconnecting pixels to one another in an electrically parallel configuration to create a parallel capacitance that is larger than capacitances of each of the interconnected pixels. The larger capacitance allows a voltage-measuring device to measure the voltage on the interconnected pixels.

The ability to dynamically measure voltage of pixels of an operating display device can allow for modifying (e.g., "optimizing") operating conditions of the pixels. For example, driving schemes that operate pixels can be adjusted to account for measured decaying pixel voltage, such as that shown by portion 206 of plot 202. In some implementations, a display device includes a control circuit to change voltage on a plurality of source lines and/or to change voltage on a plurality of gate lines of the display device in response to a dynamically measured change of voltage on one or more pixels of the display device.

Figure 3:
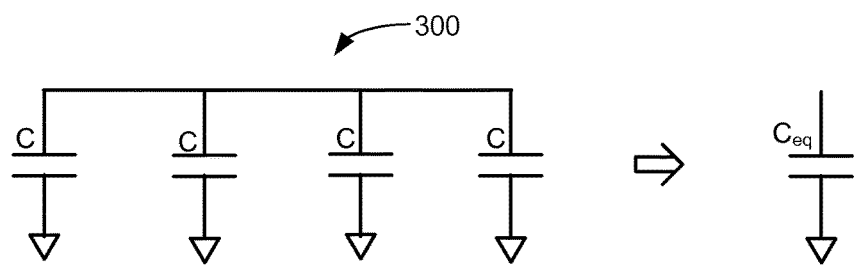
FIG. 3 illustrates equivalent capacitance for parallel capacitances of pixels of a display device, according to various example embodiments.

FIG. 3 illustrates equivalent capacitance for parallel capacitances of pixels of a display device, according to various example embodiments. For example, such pixels may be the same as or similar to pixel 100 shown in FIG. 1. In general, a number N of capacitors C connected in a parallel configuration 300 have an equivalent capacitance $C_{eq}$ given by the following relation: $C_{eq}=N*C$. Thus, for example, the equivalent capacitance of fifty interconnected pixels each having a pixel capacitance $C_{pixel}$ is $C_{eq}=50*C_{pixel}$. Such a larger capacitance allows a voltage-measuring device to measure the voltage on the interconnected pixels.

Figure 4:
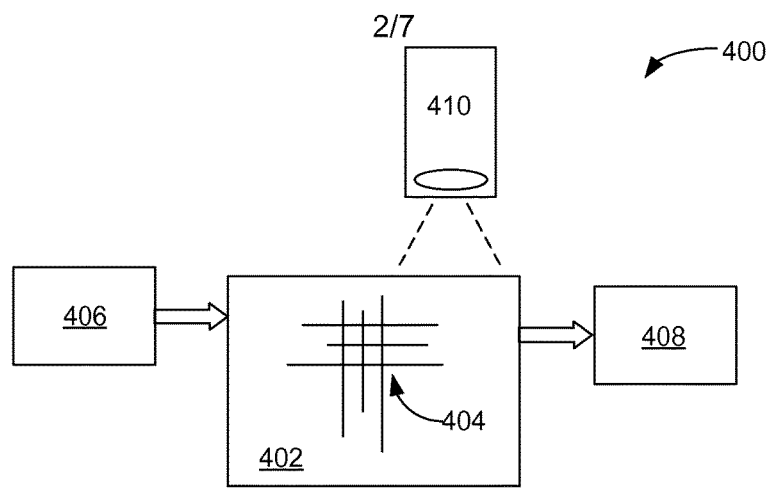
FIG. 4 is a block diagram of a system for measuring various parameters of pixels of a display device, according to various example embodiments.

FIG. 4 is a block diagram of a system 400 for measuring various parameters of pixels of a display device 402, according to various example embodiments. Display device 402 includes a plurality of rows and columns of pixels 404. A power supply 406 provides appropriate voltage levels on gate lines and source lines for addressing and driving pixels 404. At least a portion of a row or a column of pixels 404 include interconnected pixels of which pixel voltage can be measured. Such measurements are performed, for example, by a controller 408, which may include a processor, a CPU, an ASIC, a multi-meter to measure voltage and a clock, among other things. Functions of controller 408 may be implemented by software, hardware, or both. Controller 408 in system 400 can generate plots of pixel voltage as a function of time such as, for example, plot 200 shown in FIG. 2. In some implementations, to investigate physical behavior of pixels 404 over a time span as a function of pixel voltage, a camera 410 can be focused onto a portion of display device 402 to capture images of individual pixels 404 over the time span. Depending on the investigation, such a time span may be minutes, hours, days, weeks or longer, though claimed subject matter is not so limited.

Figure 5:
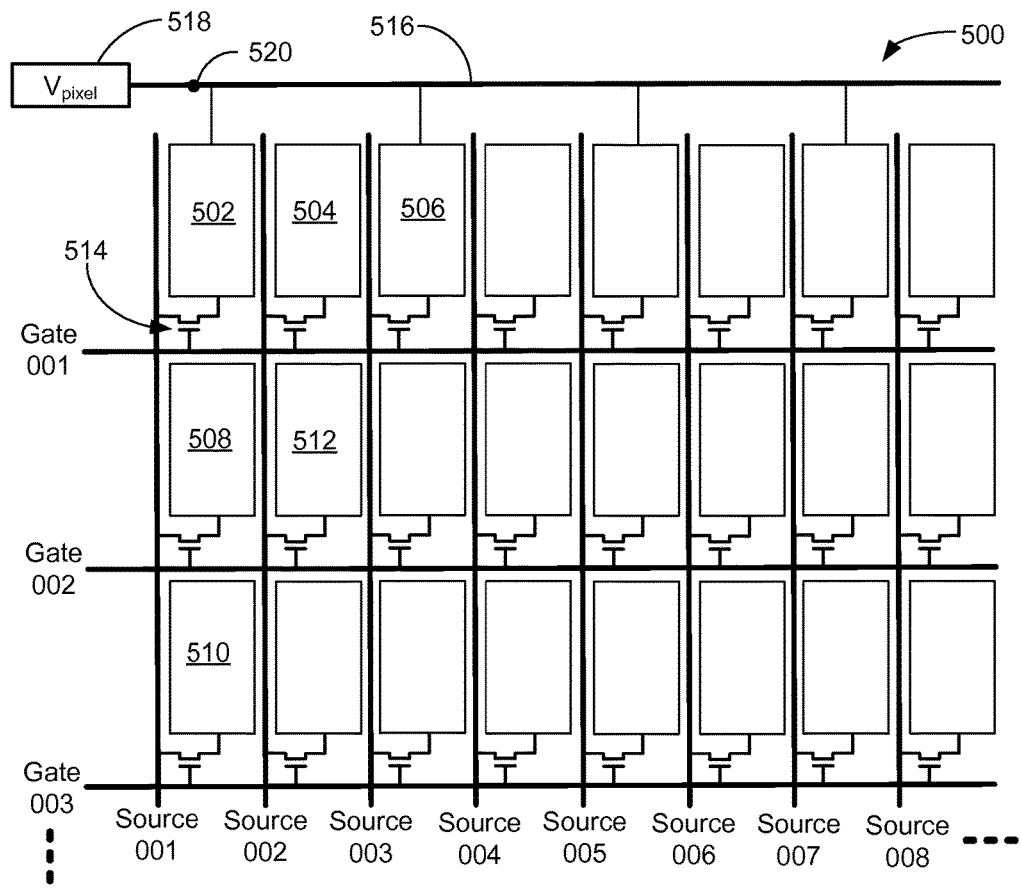
FIG. 5 is a schematic diagram of a portion of a display device, according to various example embodiments.

FIG. 5 is a schematic diagram of a portion of a display device 500, according to various example embodiments. Display device 500 includes an array of rows and columns of pixels, some of which are labeled in FIG. 5. Display device 500 can include hundreds or thousands of such rows and columns of pixels. For example, pixels 502, 504, and 506 are part of a first row or pixels. Pixels 502, 508, and 510 are part of a first column of pixels. Pixels 508 and 512 are part of a second row of pixels, and so on. Display device 500 also includes rows of gate lines (Gate001, Gate002, Gate003 . . . ) and columns of source lines (Source001, Source002, Source003 . . . ) that are connected to TFTs 514 of individual pixels. For example, pixel 504 is connected to gate line Gate001 and source line Source002 via a TFT 514 that acts as a switch to select or deselect pixel 504. In particular, gate line Gate001 is connected to gates of TFTs of all pixels in the first row of pixels and source line Source002 is connected to sources of TFTs of all pixels in the second column of pixels.

Display device 500 is configured to allow for measuring pixel voltage by interconnecting alternating pixels of the first row of pixels to one another in an electrically parallel configuration. The interconnected pixels are operated by single gate line Gate001 and multiple source lines Source001, Source002, and so on. For example, an electrical lead 516 connects to alternating pixels 502, 506 and so on to create a parallel capacitance that is larger than capacitances of each of the interconnected pixels 502, 506 and so on. The larger capacitance allows a voltage-measuring device 518 to measure the voltage $V_{pixel}$ on the interconnected pixels. Electrical lead 516 connects to drains of TFTs 514 of the individual interconnected pixels. In some implementations, a single drain connection 520 electrically ties drains of each of the TFTs 514 of each of the interconnected pixels. Electrical lead 516 may extend to outside the pixel display area of display device 500. For example, electrical lead 516 may be a conductive trace on a semiconductor circuit of display device 500. In some implementations, electrical lead 516 includes multiple conductors between the drains of TFTs 514 and probe pads that can be located near an edge of electronic circuitry of display device 500. Such a location provides relatively convenient access for a probe of voltage-measuring device 518, for example.

Though alternating pixels are interconnected in some example embodiments, as shown in FIG. 5, any pattern or combination of pixels can be interconnected to one another depending, at least in part, on an addressing or driving scheme used to operate the display device. Moreover, though pixels of the first row are interconnected in some example embodiments, claimed subject matter is not limited in this respect. A first row or first column, however, is generally conveniently located on the edge of the pixel array for relatively easy access to the pixels by electrical lead 516.

Figure 6:
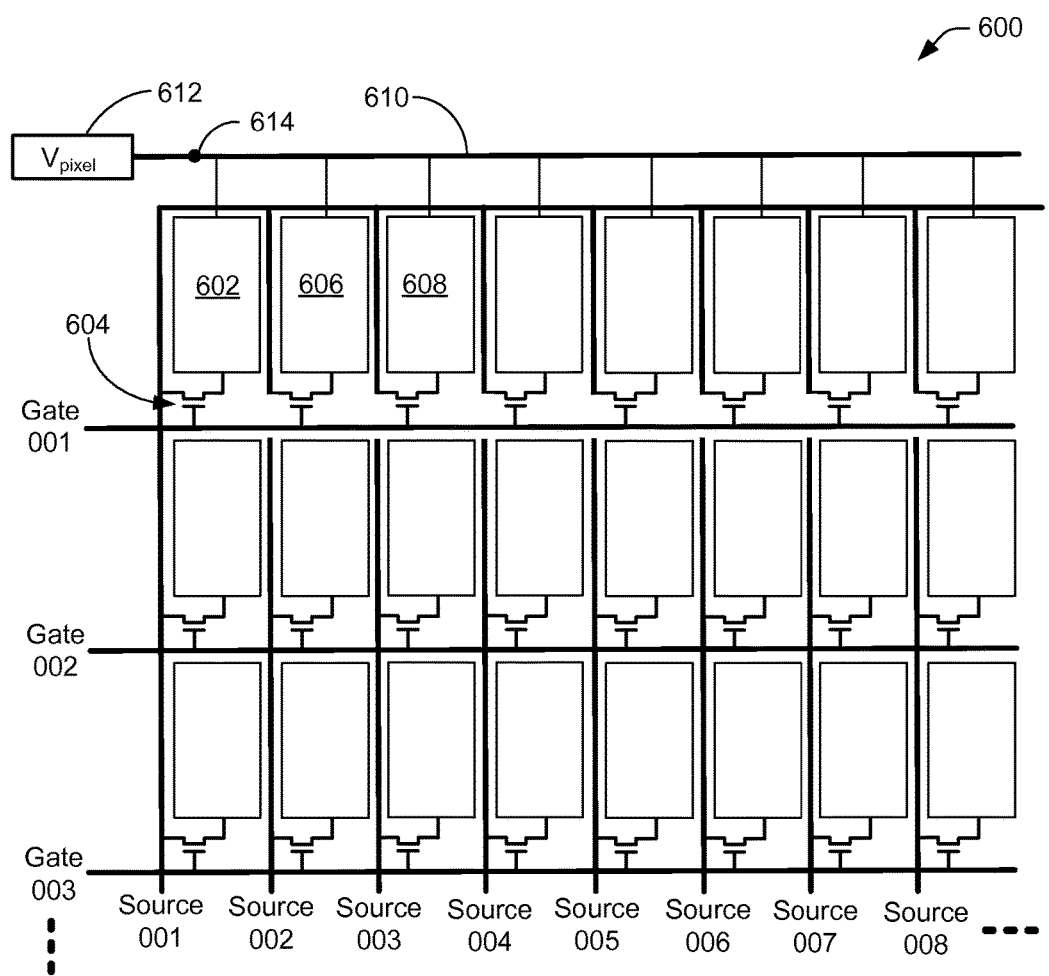
FIGS. 6-8 are schematic diagrams of a portion of display devices, according to various example embodiments.

FIG. 6 is a schematic diagram of a portion of a display device 600, according to various example embodiments. Display device 600 includes an array of rows and columns of pixels, similar to the display device 500 shown in FIG. 5. For example, pixel 602 is connected to gate line Gate001 and source line Source001 via TFT 604 that acts as a switch to select or deselect pixel 602. In particular, gate line Gate001 is connected to gates of TFTs of all pixels in the first row of pixels. In contrast to the configuration of display device 500, interconnected pixels in the first row (e.g., pixels 602, 606, 608 and so on) are connected to a single source line Source001 in display device 600. Other source lines (e.g., Source002, Source003 . . . ) are not connected to, and do not extend to, the row of interconnected pixels in the first row.

Display device 600 is configured to allow for measuring pixel voltage by interconnecting a number of pixels of the first row of pixels to one another in an electrically parallel configuration. As described above, the interconnected pixels are operated by single gate line Gate001 and a single source line Source001. An electrical lead 610 connects to pixels 602, 606, 608 and so on to create a parallel capacitance that is larger than capacitances of each of the interconnected pixels 602, 606, 608 and so on. The larger capacitance allows a voltage-measuring device 612 to measure the voltage $V_{pixel}$ on the interconnected pixels. Electrical lead 610 connects to drains of TFTs 604 of the individual interconnected pixels. In some implementations, a single drain connection 614 electrically ties together drains of each of the TFTs 604 of each of the interconnected pixels. Electrical lead 610 may extend to outside the pixel display area of display device 600. For example, electrical lead 610 may be a conductive trace on a semiconductor circuit of display device 600. In some implementations, electrical lead 610 includes multiple conductors between the drains of TFTs 604 and probe pads that can be located near an edge of electronic circuitry of display device 600. Such a location provides relatively convenient access for a probe of voltage-measuring device 612, for example.

Though a sequence of consecutive pixels are interconnected, any pattern or combination of pixels can be interconnected to one another depending, at least in part, on an addressing or driving scheme used to operate the display device. Moreover, though pixels of the first row are interconnected in some example embodiments, claimed subject matter is not limited in this respect. A first row or first column, however, is generally conveniently located on the edge of the pixel array for relatively easy access to the pixels by electrical lead 610.

Figure 7:
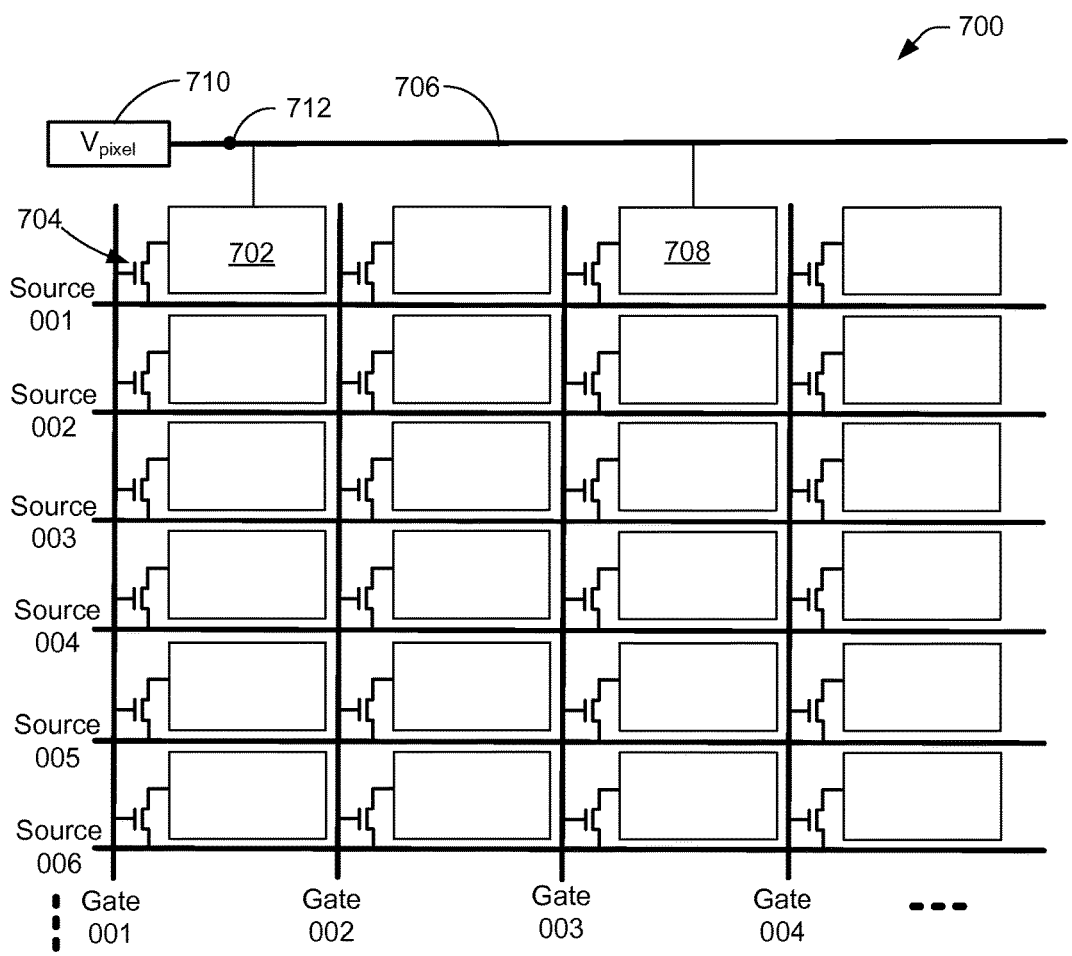

FIG. 7 is a schematic diagram of a portion of a display device 700, according to various example embodiments. Display device 700 includes an array of rows and columns of pixels, similar to the display device 500 shown in FIG. 5. Rows and columns of pixels of display device 700, however, are transposed with respect to rows and columns of display device 500. In other words, source lines are connected to rows of pixels and gate lines are connected to columns of pixels of display device 700. For example, pixel 702 is connected to source line Source001 and gate line Gate001 via TFT 704 that acts as a switch to select or deselect pixel 702. In particular, source line Source001 is connected to sources of TFTs of all pixels in the first row of pixels and gate line Gate001 is connected to gates of TFTs of all pixels in the first column of pixels. For another example, source line Source002 is connected to sources of TFTs of all pixels in the second row of pixels and gate line Gate002 is connected to gates of TFTs of all pixels in the second column of pixels.

Display device 700 is configured to allow for measuring pixel voltage by interconnecting a number of pixels of the first row of pixels to one another in an electrically parallel configuration. As described above, the interconnected pixels are operated by single source line Source001 and multiple gate lines Gate001, Gate002 . . . . An electrical lead 706 connects to alternating pixels 702, 708 and so on to create a parallel capacitance that is larger than capacitances of each of the interconnected pixels 702, 708 and so on. The larger capacitance allows a voltage-measuring device 710 to measure the voltage $V_{pixel}$ on the interconnected pixels. Electrical lead 706 connects to drains of TFTs 704 of the individual interconnected pixels. In some implementations, a single drain connection 712 electrically ties together drains of each of the TFTs 704 of each of the interconnected pixels. Electrical lead 706 may extend to outside the pixel display area of display device 700. For example, electrical lead 706 may be a conductive trace on a semiconductor circuit of display device 700. In some implementations, electrical lead 706 includes multiple conductors between the drains of TFTs 704 and probe pads that can be located near an edge of electronic circuitry of display device 700. Such a location provides relatively convenient access for a probe of voltage-measuring device 710, for example.

Though alternate pixels are interconnected, any pattern or combination of pixels can be interconnected to one another depending, at least in part, on an addressing or driving scheme used to operate the display device. Moreover, though pixels of the first row are interconnected in some example embodiments, claimed subject matter is not limited in this respect. A first row or first column, however, is generally conveniently located on the edge of the pixel array for relatively easy access to the pixels by electrical lead 706.

Figure 8:
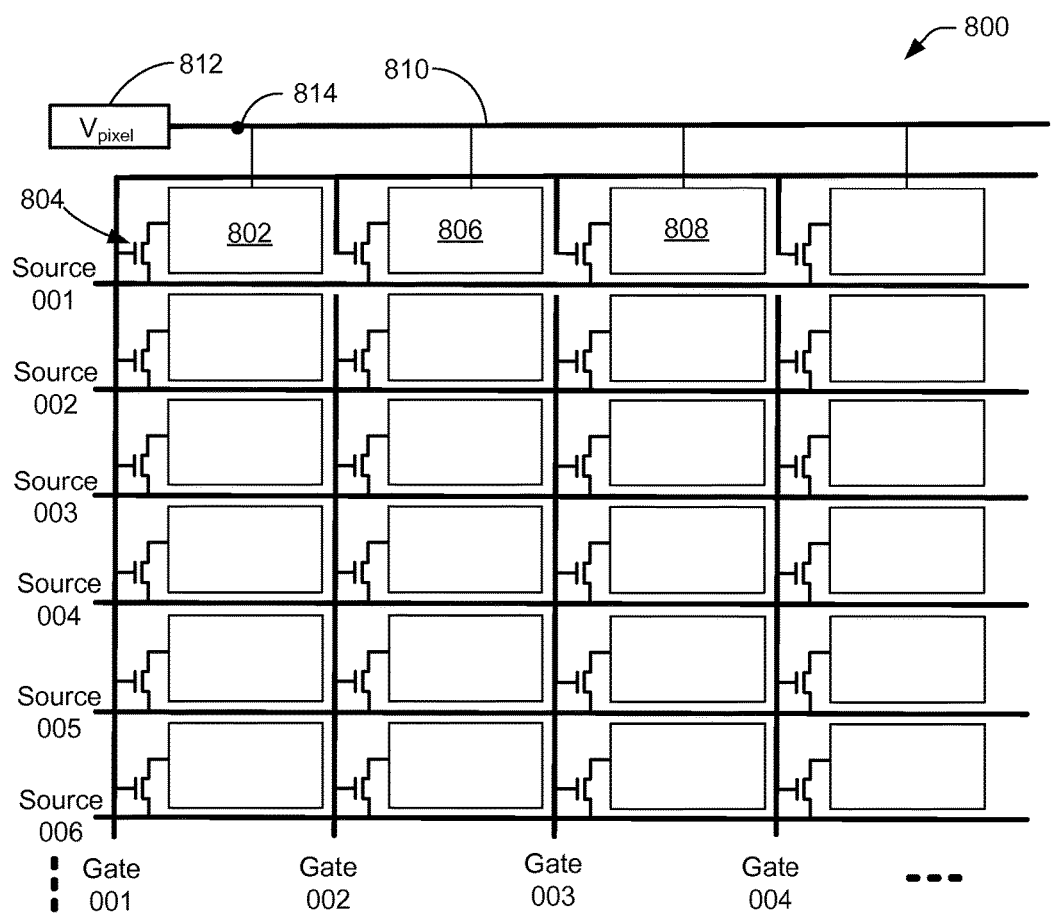

FIG. 8 is a schematic diagram of a portion of a display device 800, according to various example embodiments. Display device 800 includes an array of rows and columns of pixels, similar to the display device 700 shown in FIG. 7. For example, pixel 802 is connected to source line source001 and gate line gate001 via TFT 804 that acts as a switch to select or deselect pixel 802. In particular, source line source001 is connected to sources of TFTs of all pixels in the first row of pixels. In contrast to the configuration of display device 700, interconnected pixels in the first row (e.g., pixels 802, 806, 808 and so on) are connected to a single gate line gate001 in display device 800. Other gate lines (e.g., gate002, gate003 . . . ) are not connected to, and do not extend to, the row of interconnected pixels in the first row.

Display device 800 is configured to allow for measuring pixel voltage by interconnecting a number of pixels of the first row of pixels to one another in an electrically parallel configuration. As described above, the interconnected pixels are operated by single source line Source001 and a single gate line Gate001. An electrical lead 810 connects to pixels 802, 806, 808 and so on to create a parallel capacitance that is larger than capacitances of each of the interconnected pixels 802, 806, 808 and so on. The larger capacitance allows a voltage-measuring device 812 to measure the voltage $V_{pixel}$ on the interconnected pixels. Electrical lead 810 connects to drains of TFTs 804 of the individual interconnected pixels. In some implementations, a single drain connection 814 electrically ties together drains of each of the TFTs 804 of each of the interconnected pixels. Electrical lead 810 may extend to outside the pixel display area of display device 800. For example, electrical lead 810 may be a conductive trace on a semiconductor circuit of display device 800. In some implementations, electrical lead 810 includes multiple conductors between the drains of TFTs 804 and probe pads that can be located near an edge of electronic circuitry of display device 800. Such a location provides relatively convenient access for a probe of voltage-measuring device 812, for example.

Though a sequence of consecutive pixels are interconnected, any pattern or combination of pixels can be interconnected to one another depending, at least in part, on an addressing or driving scheme used to operate the display device. Moreover, though pixels of the first row are interconnected in some example embodiments, claimed subject matter is not limited in this respect. A first row or first column, however, is generally conveniently located on the edge of the pixel array for relatively easy access to the pixels by electrical lead 810.

Figure 9:
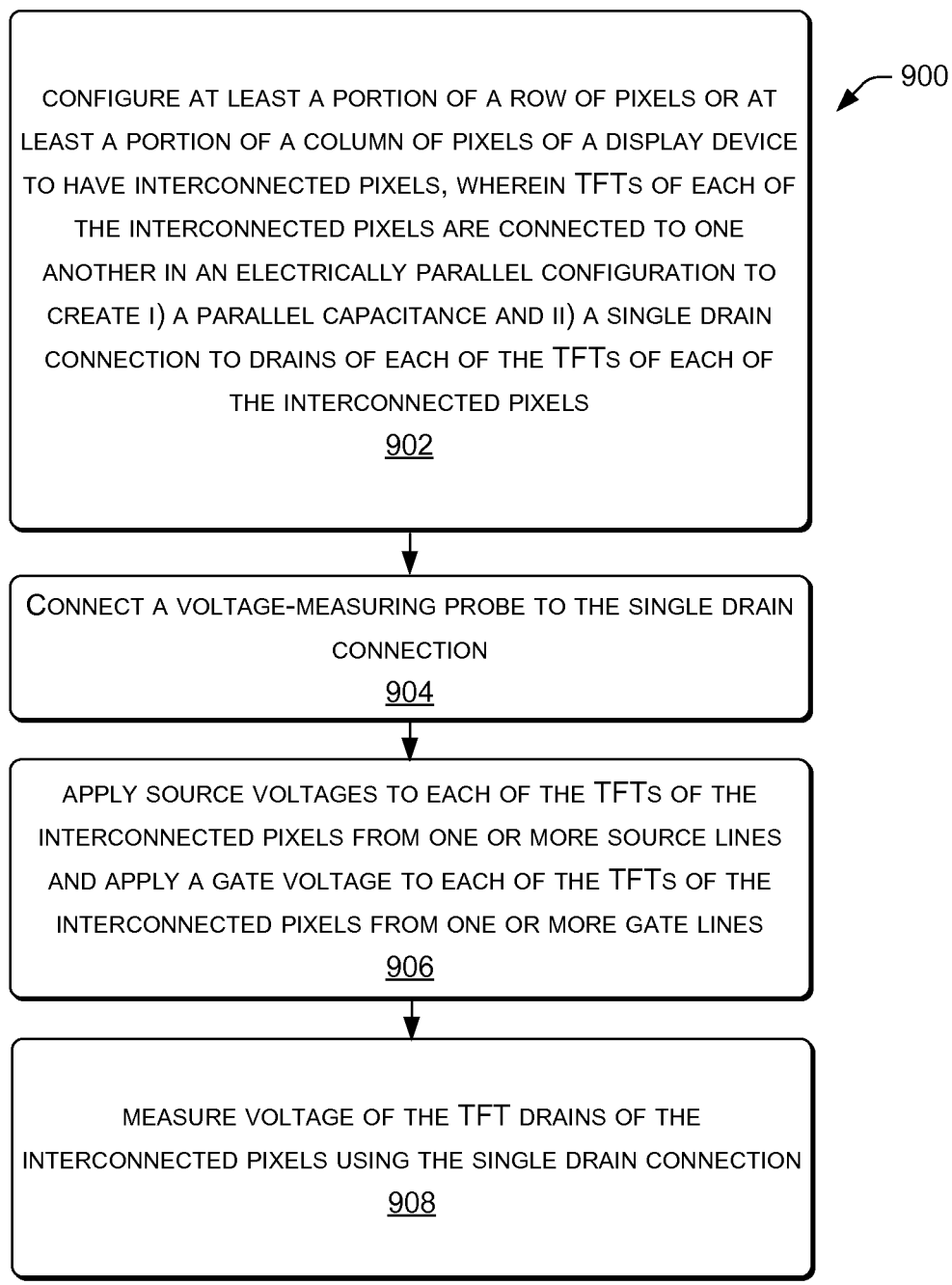
FIG. 9 is a flow diagram of a process for operating a display device, according to various example embodiments.

FIG. 9 is a flow diagram of a process 900 for operating a display device, according to various example embodiments. For example, a display device, such as display device 500 shown in FIG. 5, may be operated to display images while voltage of pixels of the display device is measured. At block 902, at least a portion of a row or at least a portion of a column of pixels of the display device is configured to have interconnected pixels. The interconnected pixels are connected to one another in an electrically parallel configuration to create a parallel capacitance that is larger than capacitances of each of the interconnected pixels. The larger capacitance allows a voltage-measuring device, such as voltage-measuring device 518 shown in FIG. 5, to measure the pixel voltage on the interconnected pixels. At block 904, a voltage-measuring lead or probe is connected to drains of TFTs of the interconnected pixels. At block 906, source voltages are applied to the TFTs of the interconnected pixels from one or more source lines. Also, a gate voltage is applied to the TFTs of the interconnected pixels from one or more gate lines. At block 908, voltage of the TFT drains of the interconnected pixels is measured using the voltage-measuring probe connected to the drains of TFTs of the interconnected pixels.

Figure 10:
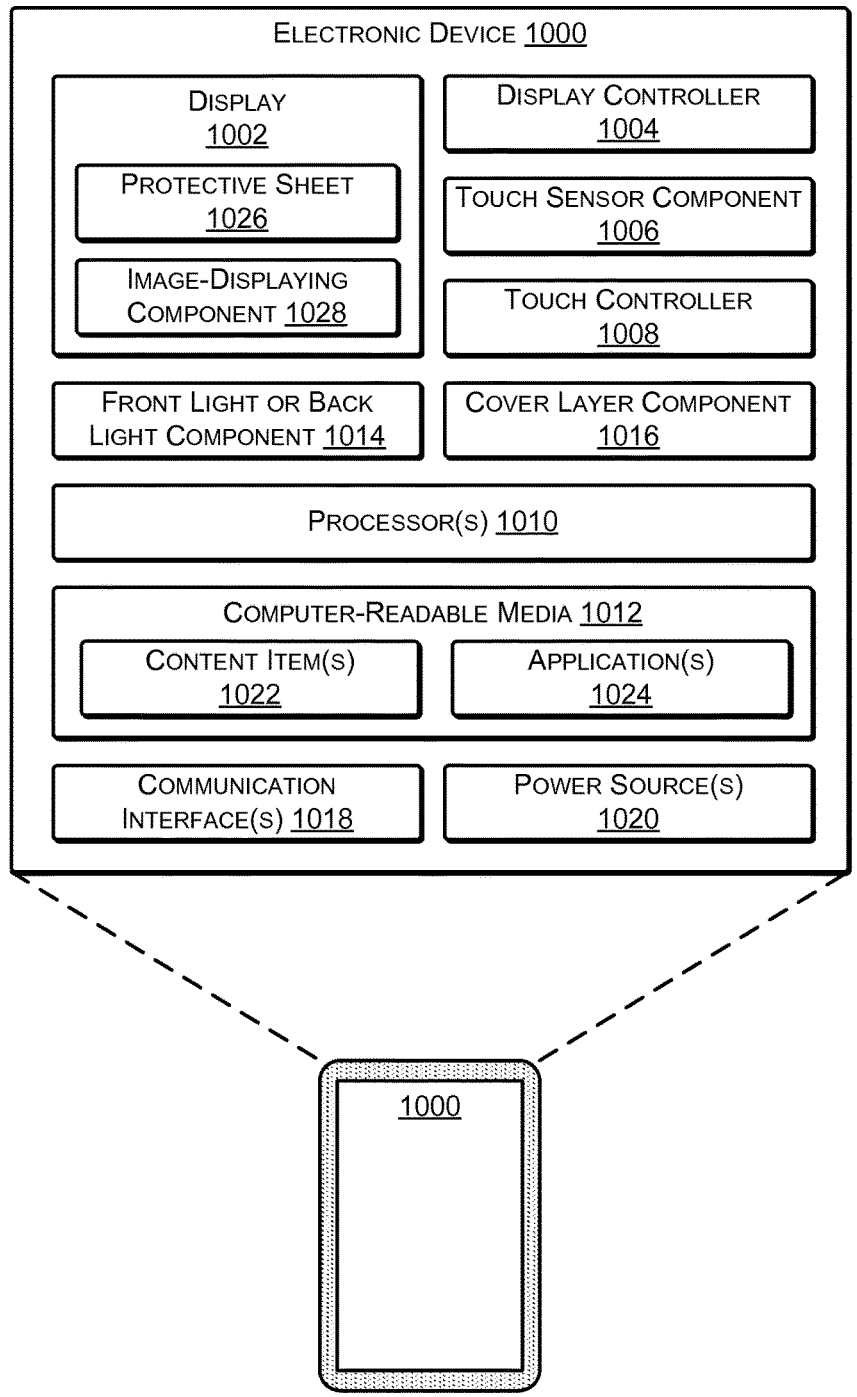
FIG. 10 illustrates an example electronic device equipped with a display device, according to some embodiments.

FIG. 10 illustrates an example electronic device 1000 that may incorporate any of the display devices discussed above. The device 1000 may comprise any type of electronic device having a display. For instance, the device 1000 may be a mobile electronic device (e.g., an electronic book reader, a tablet computing device, a laptop computer, a smart phone or other multifunction communication device, a portable digital assistant, a wearable computing device, an automotive display, etc.). Alternatively, the device 1000 may be a non-mobile electronic device (e.g., a computer display, a television, etc.). In addition, while FIG. 10 illustrates several example components of the electronic device 1000, it is to be appreciated that the device 1000 may also include other conventional components, such as an operating system, system busses, input/output components, and the like. Further, in other examples, such as in the case of a television or computer monitor, the electronic device 100 may only include a subset of the components shown.

Regardless of the specific implementation of the electronic device 1000, the device 1000 includes a display 1002 and a corresponding display controller 1004. The display 1002 may represent a reflective display in some instances, such as an electronic paper display, a reflective LCD display, or the like. Electronic paper displays represent an array of display technologies that largely mimic the look of ordinary ink on paper. In contrast to conventional backlit displays, electronic paper displays typically reflect light, much as ordinary paper does. In addition, electronic paper displays are often bi-stable, meaning that these displays are capable of holding text or other rendered images even when very little or no power is supplied to the display. Some examples of the display 1002 that may be used with the implementations described herein include bi-stable LCD displays, micro electromechanical system (MEMS) displays, such as interferometric modulator displays, cholesteric displays, electrophoretic displays, electrofluidic pixel displays, electrowetting displays, photonic ink displays, gyricon displays, and the like. In other implementations, or for other types of devices 1000, the display 1002 may be an active display such as a liquid crystal display, a plasma display, a light emitting diode display, an organic light emitting diode display, and so forth. Accordingly, implementations herein are not limited to any particular display technology.

In one implementation, the display 1002 comprises an electrophoretic display that moves particles between different positions to achieve different color shades. For instance, in a pixel that is free from a color filter, the pixel may be configured to produce white when the particles within this pixel are located at the front (i.e., viewing) side of the display. When situated in this manner, the particles reflect incident light, thus giving the appearance of a white pixel. Conversely, when the particles are pushed near the rear of the display, the display absorbs the incident light and, hence, causes the pixel to appear black to a viewing user. In addition, the particles may situate at varying locations between the front and rear sides of the display to produce varying shades of gray. Furthermore, as used herein, a "white" pixel may comprise any shade of white or off white, while a "black" pixel may similarly comprise any shade of black.

In another implementation, the display 1002 comprises an electrophoretic display that includes oppositely charged light and dark particles. In order to create white, the display controller moves the light particles to the front side of the display by creating a corresponding charge at an electrode near the front and moves the dark particles to the back of the display by creating a corresponding charge at an electrode near the back. In order to create black, meanwhile, the controller changes the polarities and moves the dark particles to the front and the light particles to the back. Furthermore, to create varying shades of gray, the controller 1004 may utilize different arrays of both light and dark particles. In some cases, the particles may be contained in tiny individual transparent capsules, such as approximately 40 micrometers in diameter. The capsules are suspended in a fluid, such as a liquid polymer, between a transparent upper electrode grid layer and a lower electrode grid layer separated by a gap, such as approximately 50-200 micrometers.

In still another implementation, the display comprises an electrowetting display that employs an applied voltage to change the surface tension of a liquid in relation to a surface. For instance, by applying a voltage to a hydrophobic surface, the wetting properties of the surface can be modified so that the surface becomes increasingly hydrophilic. As one example of an electrowetting display, the modification of the surface tension acts as an optical switch by contracting a colored oil film when a voltage is applied to individual pixels of the display. When the voltage is absent, the colored oil forms a continuous film within a pixel, and the color may thus be visible to a user of the display. On the other hand, when the voltage is applied to the pixel, the colored oil is displaced and the pixel becomes transparent. When multiple pixels of the display are independently activated, the display can present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video content. In addition, the lower power consumption of electrowetting displays in comparison to conventional LCD displays makes the technology suitable for displaying content on portable devices that rely on battery power.

Of course, while several different examples have been given, it is to be appreciated that the reflective displays described herein may comprise any other type of electronic-paper technology or reflective-display technology, examples of which are provided above. In addition, while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "black" value of the pixel may correspond to a darkest red of the color filter. Furthermore, while some examples herein are described in the environment of a reflective display, in other examples, the display 102 may represent a backlit display, examples of which are mentioned above.

In addition to including the display 1002, FIG. 10 illustrates that some examples of the device 1000 may include a touch sensor component 1006 and a touch controller 1008. In some instances, at least one touch sensor component 1006 resides with, or is stacked on, the display 1002 to form a touch-sensitive display (e.g., an electronic paper touch-sensitive display). Thus, the display 1002 may be capable of both accepting user touch input and rendering content in response to or corresponding to the touch input. As several examples, the touch sensor component 1006 may comprise a capacitive touch sensor, a force sensitive resistance (FSR), an interpolating force sensitive resistance (IFSR) sensor, or any other type of touch sensor. In some instances, the touch sensor component 1006 is capable of detecting touches as well as determining an amount of pressure or force of these touches.

FIG. 10 further illustrates that the electronic device 1000 may include one or more processors 1010 and one or more computer-readable media 1012, as well as a front light component 1014 (which may alternatively be a backlight component in the case of a backlit display) for lighting the display 1002, a cover layer component 1016, such as a cover glass or cover sheet, one or more communication interfaces 1018 and one or more power sources 1020. The communication interfaces 1018 may support both wired and wireless connection to various networks, such as cellular networks, radio, WiFi networks, short range networks (e.g., Bluetooth®), infrared (IR), and so forth. In some implementations, one or more processors are the same or similar to controller 408, shown in FIG. 4. In such implementations, one or more processors 1010 can include a device to measure voltage, for example.

Depending on the configuration of the electronic device 1000, the computer-readable media 1012 (and other computer-readable media described throughout) is an example of computer storage media and may include volatile and non-volatile memory. Thus, the computer-readable media 1012 may include, but is not limited to, RAM, ROM, EEPROM, flash memory, or other memory technology, or any other medium that can be used to store computer-readable instructions, programs, applications, media items, and/or data which can be accessed by the electronic device 1000.

The computer-readable media 1012 may be used to store any number of functional components that are executable on the processor 1010, as well as content items 1022 and applications 1024. Thus, the computer-readable media 1012 may include an operating system and a storage database to store one or more content items 1022, such as eBooks, audio books, songs, videos, still images, and the like. The computer-readable media 1012 of the electronic device 1000 may also store one or more content presentation applications to render content items on the device 1000. These content presentation applications may be implemented as various applications 1024 depending upon the content items 1022. For instance, the content presentation application may be an electronic book reader application for rending textual electronic books, an audio player for playing audio books or songs, a video player for playing video, and so forth.

In some instances, the electronic device 1000 may couple to a cover (not shown in FIG. 10) to protect the display (and other components in the display stack or display assembly) of the device 1000. In one example, the cover may include a back flap that covers a back portion of the device 1000 and a front flap that covers the display 1002 and the other components in the stack. The device 1000 and/or the cover may include a sensor (e.g., a Hall effect sensor) to detect when the cover is open (i.e., when the front flap is not atop the display and other components). The sensor may send a signal to the front light component 1014 when the cover is open and, in response, the front light component 1014 may illuminate the display 1002. When the cover is closed, meanwhile, the front light component 1014 may receive a signal indicating that the cover has closed and, in response, the front light component 1014 may turn off.

Furthermore, the amount of light emitted by the front light component 1014 may vary. For instance, upon a user opening the cover, the light from the front light may gradually increase to its full illumination. In some instances, the device 1000 includes an ambient light sensor (not shown in FIG. 10) and the amount of illumination of the front light component 1014 may be based at least in part on the amount of ambient light detected by the ambient light sensor. For example, the front light component 1014 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of the display 1002 may vary depending on whether the front light component 1014 is on or off, or based on the amount of light provided by the front light component 1014. For instance, the electronic device 1000 may implement a larger default font or a greater contrast when the light is off compared to when the light is on. In some instances, the electronic device 1000 maintains, when the light is on, a contrast ratio for the display that is within a certain defined percentage of the contrast ratio when the light is off.

As described above, the touch sensor component 1006 may comprise a capacitive touch sensor that resides atop the display 1002. In some examples, the touch sensor component 1006 may be formed on or integrated with the cover layer component 1016. In other examples, the touch sensor component 1006 may be a separate component in the stack of the display assembly. The front light component 1014 may reside atop or below the touch sensor component 1006. In some instances, either the touch sensor component 1006 or the front light component 1014 is coupled to a top surface of a protective sheet 1026 of the display 1002. As one example, the front light component 1014 may include a lightguide sheet and a light source (not shown in FIG. 10). The lightguide sheet may comprise a substrate (e.g., a transparent thermoplastic such as PMMA or other acrylic), a layer of lacquer and multiple grating elements formed in the layer of lacquer that function to propagate light from the light source towards the display 1002, thus illuminating the display 1002.

The cover layer component 1016 may include a transparent substrate or sheet having an outer layer that functions to reduce at least one of glare or reflection of ambient light incident on the electronic device 1000. In some instances, the cover layer component 1016 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3h pencil). Without such scratch resistance, a device may be more easily scratched and a user may perceive the scratches from the light that is dispersed over the top of the reflective display. In some examples, the protective sheet 1026 may include a similar UV-cured hard coating on the outer surface. The cover layer component 1016 may couple to another component or to the protective sheet 1026 of the display 1002. The cover layer component 1016 may, in some instances, also include a UV filter, a UV-absorbing dye, or the like, for protecting components lower in the stack from UV light incident on the electronic device 1000. In still other examples, the cover layer component 1016 may include a sheet of high-strength glass having an antiglare and/or antireflective coating.

The display 1002 includes the protective sheet 1026 overlying an image-displaying component 1028. For example, the display 1002 may be preassembled to have the protective sheet 1026 as an outer surface on the upper or image-viewing side of the display 1002. Accordingly, the protective sheet 1026 may be integral with and may overlie the image-displaying component 1028. The protective sheet 1026 may be optically transparent to enable a user to view, through the protective sheet 1026, an image presented on the image-displaying component 1028 of the display 1002.

In some examples, the protective sheet 1026 may be a transparent polymer film in the range of 25 to 200 micrometers in thickness. As several examples, the protective sheet may be a transparent polyester, such as polyethylene terephthalate (PET) or polyethylene naphthalate (PEN), or other suitable transparent polymer film or sheet, such as a polycarbonate or an acrylic. In some examples, the outer surface of the protective sheet 126 may include a coating, such as the hard coating described above. For instance, the hard coating may be applied to the outer surface of the protective sheet 1026 before or after assembly of the protective sheet 1026 with the image-displaying component 1028 of the display 1002. In some examples, the hard coating may include a photoinitiator or other reactive species in its composition, such as for curing the hard coating on the protective sheet 1026. Furthermore, in some examples, the protective sheet 1026 may be dyed with a UV-light-absorbing dye, or may be treated with other UV-absorbing treatment. For example, the protective sheet may be treated to have a specified UV cutoff such that UV light below a cutoff or threshold wavelength is at least partially absorbed by the protective sheet 1026, thereby protecting the image-displaying component 1028 from UV light.

According to some implementations herein, one or more of the components discussed above may be coupled to the display 1002 using LOCA. For example, suppose that the light guide portion of the front light component 1014 is to be coupled to the display 1002. The light guide may be coupled to the display 1002 by placing the LOCA on the outer or upper surface of the protective sheet 1026. When the LOCA reaches the corner(s) and/or at least a portion of the perimeter of protective sheet, UV-curing may be performed on the LOCA at the corners and/or the portion of the perimeter. Thereafter, the remaining LOCA may be UV-cured and the front light component 1014 may be coupled to the LOCA. By first curing the corner(s) and/or perimeter, the techniques effectively create a barrier for the remaining LOCA and also prevent the formation of air gaps in the LOCA layer, thereby increasing the efficacy of the front light component 1014. In other implementations, the LOCA may be placed near a center of the protective sheet 1026, and pressed outwards towards a perimeter of the top surface of the protective sheet 126 by placing the front light component 1014 on top of the LOCA. The LOCA may then be cured by directing UV light through the front light component 1014. As discussed above, and as discussed additionally below, various techniques, such as surface treatment of the protective sheet, may be used to prevent discoloration of the LOCA and/or the protective sheet 1026.

While FIG. 10 illustrates a few example components, the electronic device 1000 may have additional features or functionality. For example, the device 1000 may also include additional data storage devices (removable and/or non-removable) such as, for example, magnetic disks, optical disks, or tape. The additional data storage media may include volatile and nonvolatile, removable and non-removable media implemented in any method or technology for storage of information, such as computer readable instructions, data structures, program modules, or other data. In addition, some or all of the functionality described as residing within the device 1000 may reside remotely from the device 1000 in some implementations. In these implementations, the device 1000 may utilize the communication interfaces 1018 to communicate with and utilize this functionality.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications can be made, and equivalents can be substituted, without departing from claimed subject matter. Additionally, many modifications can be made to adapt a particular situation to the teachings of claimed subject matter without departing from the central concept described herein. Therefore, it is intended that claimed subject matter not be limited to the particular embodiments disclosed, but that such claimed subject matter can also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter can be practiced without these specific details. In other instances, methods, apparatuses, or systems that would be known by one of ordinary skill have not been described in detail so as not to obscure claimed subject matter.

Reference throughout this specification to "one embodiment" or "an embodiment" can mean that a particular feature, structure, or characteristic described in connection with a particular embodiment can be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described can be combined in various ways in one or more embodiments. In general, of course, these and other issues can vary with the particular context of usage. Therefore, the particular context of the description or the usage of these terms can provide helpful guidance regarding inferences to be drawn for that context.

What is claimed is:

1. A method for measuring pixel voltage of an electrowetting display device, the method comprising:
    configuring at least one of i) a portion of a row of pixels of the electrowetting display device or ii) a portion of a column of the pixels of the electrowetting display device to have interconnected pixels, wherein thin film transistors (TFTs) for individually selecting respective each of the interconnected pixels are connected to one another in an electrically parallel configuration to create i) a parallel capacitance and ii) a single drain connection to drains of each of the TFTs of each of the interconnected pixels;
    during operation of the electrowetting display device:
        connecting a voltage probe to the single drain connection;
        applying source voltages to each of the TFTs of the interconnected pixels from one or more source lines;
        applying a gate voltage to each of the TFTs of the interconnected pixels from one or more gate lines;
        measuring, with the voltage probe, a voltage of the single drain connection over a time span;
        capturing, by at least one camera, images of at least a portion of the interconnected pixels over at least a portion of the time span to measure changes of at least one of optical transmission or optical reflection of the at least a portion of the interconnected pixels; and
        comparing the voltage of the single drain connection to the changes of the at least one of the optical transmission or the optical reflection.

2. The method of claim 1, wherein connecting the voltage probe to the single drain connection of the electrowetting display device comprises forming conductive traces on a semiconductor circuit of the electrowetting display device.

3. The method of claim 1, further comprising, during operation of the electrowetting display device, adjusting the source voltages applied to each of the TFTs based, at least in part, on differences among the multiple images.

4. A method comprising:
    applying voltage to sources of a thin film transistor (TFT) that is used to select an individual pixel of each of a plurality of pixels of a display device, wherein each of the TFTs has drains that are interconnected in an electrically parallel configuration to create i) a parallel capacitance and ii) a single drain connection to the drains of each of the TFTs;
    applying voltages to gates of each of the TFTs;
    measuring a voltage of the single drain connection; and
    during operation of the display device,
        adjusting the voltages applied to the sources or the voltages applied to the gates to increase light transmission through the plurality of pixels, wherein the adjusting is in response to a change of the voltage of the single drain connection,
        capturing, by at least one camera, images of light emitted by at least a portion of the plurality of pixels over a time span to measure changes of at least one of optical transmission or optical reflection of the at least the portion of the plurality of pixels; and
        comparing the voltage of the single drain connection to the changes of the at least one of the optical transmission or the optical reflection over the time span.

5. The method of claim 4, wherein measuring the voltage of the single drain connection further comprises:
    connecting a voltage probe to the single drain connection using conductive traces on a semiconductor circuit of the display device.

6. The method of claim 5, wherein the voltage probe comprises a field effect transistor (FET) probe.

7. The method of claim 4, further comprising:
connecting a single gate line of the display device to the plurality of pixels; and
connecting each of a plurality of source lines of the display device to each of the plurality of pixels.

8. The method of claim 4, further comprising:
connecting a single gate line of the display device to the plurality of pixels; and
connecting a single source line of the display device to the plurality of pixels.

9. The method of claim 4, further comprising:
connecting a single source line of the display device to the plurality of pixels; and
connecting each of a plurality of gate lines of the display device to each of the plurality of pixels.

10. The method of claim 4, wherein applying the voltages to the sources of the TFT of each of the plurality of pixels is performed from one or more source lines of the display device, and wherein applying the voltages to the gates of each of the TFTs is performed from one or more gate line lines of the display device.

11. The method of claim 4, wherein the display device comprises an electrowetting display device.

12. The method of claim 4, wherein the parallel capacitance of the electrically parallel configuration is at least ten times larger than the capacitances of each of the plurality of pixels.

13. A display device comprising:
a plurality of rows and columns of pixels that each have an intrinsic capacitance formed in part by electrowetting material, wherein each of the pixels includes a thin film transistor (TFT) that is switched on to respectively select each of the pixels using active matrix addressing;
a plurality of source lines connected to the TFT of each of the pixels;
a plurality of gate lines connected to the TFT of each of the pixels;
at least one of i) a row or ii) a column including interconnected pixels connected to one another in an electrically parallel configuration to create i) a parallel capacitance and ii) a single drain connection to drains of each of the TFTs of each of the interconnected pixels;
an output lead to connect to a voltage probe, wherein the output lead is electrically connected to the single drain connection to measure voltage of the single drain connection; and
a control circuit to:
affect optical transmission of the interconnected pixels by at least one of increasing or decreasing voltage on i) the plurality of source lines or ii) the plurality of gate lines in response to a change of the voltage measured on the output lead;
receive images of at least a portion of the interconnected pixels over a time span to measure changes of at least one of optical transmission or optical reflection of the interconnected pixels; and
compare the voltage of the single drain connection to the changes of the at least one of the optical transmission or the optical reflection.

14. The display device of claim 13, wherein the interconnected pixels are connected to a single gate line and a single source line.

15. The display device of claim 13, wherein the output lead comprises conductive traces on a semiconductor circuit of the display device.

16. The display device of claim 13, wherein the electrowetting material comprises an electrolyte.

17. The display device of claim 13, wherein the parallel capacitance of the electrically parallel configuration is at least ten times larger than the capacitances of each of the interconnected pixels.

18. The display device of claim 13, wherein the electrowetting material comprises a colored oil.

\* \* \* \* \*

UNITED STATES PATENT AND TRADEMARK OFFICE
CERTIFICATE OF CORRECTION

PATENT NO. : 9,939,484 B1  
APPLICATION NO. : 14/135090  
DATED : April 10, 2018  
INVENTOR(S) : Sakai et al.

Page 1 of 1

It is certified that error appears in the above-identified patent and that said Letters Patent is hereby corrected as shown below:

In the Claims

In Column 14, Line 40, in Claim 4, delete "applying voltage" and insert -- applying voltages --, therefor.

In Column 14, Line 59, in Claim 4, delete "pixels; and" and insert -- pixels, and --, therefor.

In Column 15, Lines 22-23, in Claim 10, delete "line lines" and insert -- lines --, therefor.

Signed and Sealed this
Sixteenth Day of April, 2019

Andrei Iancu
*Director of the United States Patent and Trademark Office*